(12) United States Patent
Herbert

(10) Patent No.: US 6,549,411 B1
(45) Date of Patent: Apr. 15, 2003

(54) FLEXIBLE HEAT SINKS AND METHOD OF ATTACHING FLEXIBLE HEAT SINKS

(76) Inventor: Edward Herbert, 1 Dyer Cemetery Rd., Canton, CT (US) 06019

( * ) Notice: Subject to any disclaimer, the term of this patent is extended or adjusted under 35 U.S.C. 154(b) by 0 days.

(21) Appl. No.: 10/028,604

(22) Filed: Dec. 19, 2001

Related U.S. Application Data

(60) Provisional application No. 60/256,641, filed on Dec. 20, 2000.

(51) Int. Cl.[7] .................................................. H05K 7/20
(52) U.S. Cl. ....................................................... 361/704
(58) Field of Search ............................. 165/80.2, 80.3, 165/185; 174/16.3, 252; 257/706–707, 712–713, 722, 718–719; 361/704–710, 717–721; 428/40.5; 29/890.03; 156/247, 306.6, 324.4

(56) References Cited

U.S. PATENT DOCUMENTS

| 4,688,077 | A | * | 8/1987 | Wakabaayashi et al. .... 257/707 |
| 5,146,981 | A | * | 9/1992 | Samarov ...................... 165/185 |
| 5,467,251 | A | * | 11/1995 | Katchmar .................... 361/719 |
| 5,646,826 | A | * | 7/1997 | Katchmar .................... 361/704 |
| 5,796,582 | A | * | 8/1998 | Katchmar .................... 361/704 |
| 6,367,541 | B2 | * | 4/2002 | Mccullough ............... 165/80.3 |

* cited by examiner

Primary Examiner—Gregory Thompson

(57) ABSTRACT

This invention teaches that the heat sink and/or the object from which heat is to be removed may have significant flexibility. Indeed, it may be advantageous for one or both to have significant flexibility in that it allows good conformity for good thermal contact even if one or the other is uneven. The heat sink is attached to the object from which heat is to be removed with a good adhesive or solder under vacuum or with external pressure. The flexible heat sink may be much smaller and lighter in weight than a conventional heat sink. It may use less material and have less stringent machining requirements, so it may be much more economical to fabricate and use. Because a vacuum is used to pull the interface together at all points, there are fewer gaps or voids and the adhesive layer may be much thinner, for improved heat conduction.

20 Claims, 4 Drawing Sheets

FLEXIBLE HEAT SINKS AND METHOD OF ATTACHING FLEXIBLE HEAT SINKS

This is a continuation-in-part of a provisional patent application having the same name, Serial No. 60/256,641, filed Dec. 20, 2000. Priority to that date is claimed.

BACKGROUND OF THE INVENTION

This invention relates to heat sinks and methods of attaching heat sinks to objects from which heat is to be removed.

It is very important to have a good thermal interface between a heat sink and the object from which heat is to be removed. Usually this is accomplished by manufacturing both pieces to have flat heat sink surfaces and by fastening them tightly together. Often a thermal compound is used to fill any gaps between the flat heat sink surfaces.

To have stable flat surfaces, both the heat sink and the object from which heat is to be removed must have substantial strength and mechanical integrity. In many cases the heat sink is an aluminum extrusion of substantial thickness. Sometimes it is a casting having a machined heat sink surface, or a fabricated part such as a heavy copper plate with a plurality of fins brazed or bonded therein. It is usually necessary to machine the heat sink surface to ensure good thermal contact.

SUMMARY OF THE INVENTION

This invention teaches that the heat sink and/or the object from which heat is to be removed may have significant flexibility. Indeed, it may be advantageous for one or both to have significant flexibility in that it allows good conformity for good thermal contact even if one or the other is uneven.

The heat sink is attached to the object from which heat is to be removed with a good adhesive or solder under vacuum or with external pressure.

The flexible heat sink of this invention may be much smaller and lighter in weight than a conventional heat sink. It may use less material and have less stringent machining requirements, so it may be much more economical to fabricate and use.

Because a vacuum is used to pull the interface together at all points, there are fewer gaps or voids and the adhesive layer may be much thinner, for improved heat conduction. The amount of excess adhesive drawn from the interface may be a good indicator of the interface integrity.

DESCRIPTION OF THE PREFERRED EMBODIMENT

Figure 1:
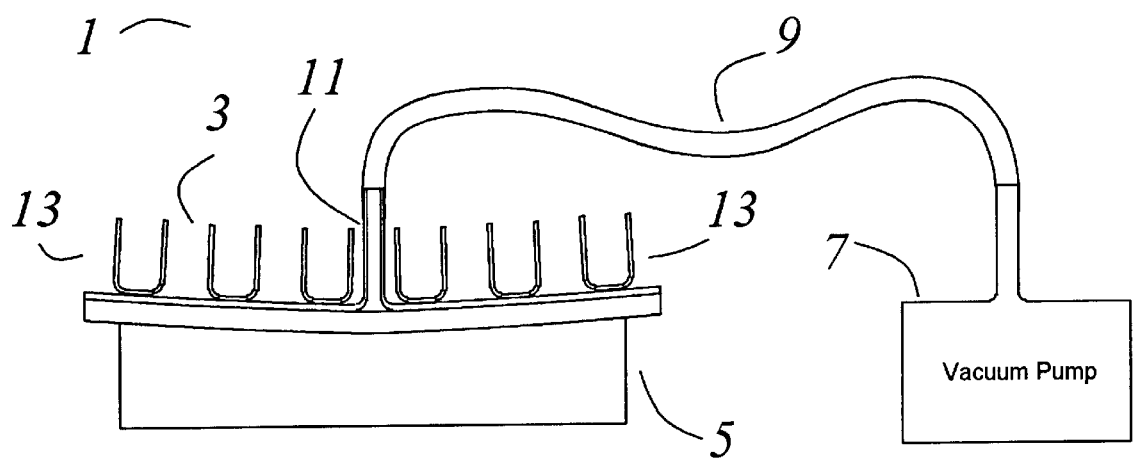
FIG. 1 shows a flexible heat sink of this invention being attached to a module having an uneven surface using a vacuum.

The assembly 1 of FIG. 1 shows a heat sink 3 attached to a module 5. The heat sink 3 is flexible, and is further described below in reference to FIG. 3. The heat sink 3 has a plurality of heat sink fins 13, 13 bonded to it, as by brazing, seam welding, adhesive bonding or the like, as illustrations, not limitations.

The module 5 is drawn with an exaggerated warping of the surface to which the heat sink 3 is attached. Nonetheless, the heat sink 3 is sufficiently flexible to conform very well and has good thermal contact with the module 5.

In the specification and the claims, a heat sink is said to have "good thermal contact" with an object from which heat is to be removed if it is closely proximate over the surface of the contact (the "heat sink surface") and if the surface of contact is reasonably free of voids or extraneous material having poor thermal conduction. There may be a thin sheet of electrically insulating material, for dielectric isolation, if a particular application requires that. "Good thermal contact" is characterized by having good thermal conductivity to promote heat flow.

Because heat flow is reciprocal, and reverses if the temperature differential between two objects is reversed, this invention applies equally to heat flow in either direction. Accordingly, in the specification and the claims, a "heat sink" can be a source of heat if the temperature deferential is reversed, and an "object from which heat is to be removed" can similarly receive heat in some circumstances, and the claims should be interpreted to include heat flow in either direction.

A "heat sink" is often a finned aluminum extrusion or a copper plate to which fins, posts, or the like have been bonded, but many other devices can receive or deliver heat, and they are all equivalent for the purposes of this invention if they include a "heat sink surface" to which an "object from which heat is to be removed" can be attached with a "good thermal contact". In the specification and the claims, "heat sink" may include any sink or source of heat, as examples, not limitations, a devise for facilitating the conduction of heat to a medium surrounding the heat sink by conduction, convection or radiation; a device for facilitating the conduction of heat to a medium flowing through it; a device that sinks or sources heat due to a phase change of material therein; a cold plate that is part of a refrigeration system, thermoelectric cooler or the like; or a hot plate that is part of a heater.

The heat sink 3 has therein a hole with a tube 11 extending from the heat sink heat surface. To attach the heat sink 3, a liberal amount of adhesive may be applied between the heat sink 3 and the module 5 as they are brought into contact. A vacuum pump 7 is connected to the tube 11 of the heat sink 3 through a hose 9. When the vacuum pump 7 is operated, the heat sink surfaces of the heat sink 3 and the module 5 are drawn tightly together due to the external ambient air pressure, and any excess adhesive is sucked away, leaving an optimally thin adhesive layer.

The peripheral edge of the interface between the heat sink 3 and the module 5 must be sealed, but in many instances the viscosity of the adhesive and its wetting energy to the heat sink surfaces will be sufficient to provide a seal unless one or both of the surface is excessively distorted. If, in some applications, this is insufficient, then other sealing means such as gaskets or "o" rings may be used.

"Flexible" means that the metal comprising the heat sink surface is sufficiently compliant that the pressure differential can deform it sufficiently to make good thermal contact with a mating heat sink surface. Although in some case it may be very flexible, in practice, it could be of fairly stiff material such as thin copper sheet, perhaps half hard. Flexible is a relative term in this context, and means that the metal of which the heat sink surface is made is sufficiently compliant to yield to the vacuum or differential pressure used. This may require only a fraction of a millimeter movement, so "flexible" in this context could be quite stiff.

The degree of flexibility may also depend upon the kind of surface defect that is to be accommodated. If it is necessary to flatten dents or pull the heat sink surfaces together around entrapped particles, more flexibility would be required than if it is only necessary to remove slight warping over the whole surface where the curvature has a very large radius.

If the base of the heat sink 3 is very soft, such as annealed copper or soft aluminum, as examples, not limitations, then the vacuum may also reform the heat sink 3 to conform to the object from which heat is to be removed. Additional mechanical fasteners may be used if necessary.

Obviously the vacuum must be maintained until the bond strength is strong enough so that the surfaces do not pull apart again. There are a number of ways that this can be accomplished, as illustrations, not limitations. If the adhesive is a contact adhesive, then the bond will be made as soon as the surfaces are brought together. If the adhesive is a thermoplastic adhesive or solder, then the bond will be strong as soon as the surfaces are cooled. If the adhesive is a thermosetting adhesive, the bond will be strong as soon as the thermosetting adhesive is cured. However, in the last example, it may be sufficient to draw the vacuum, then crimp the tube 11. The vacuum will hold for a period of time, and that period of time may be sufficient for the adhesive to cure.

A thermoplastic adhesive or solder would have the advantage that the heat sink 3 could be removed with the application of heat. However, it would be preferred that the melting or softening temperature be above the normal operating temperature range of the assembly.

Figure 2:
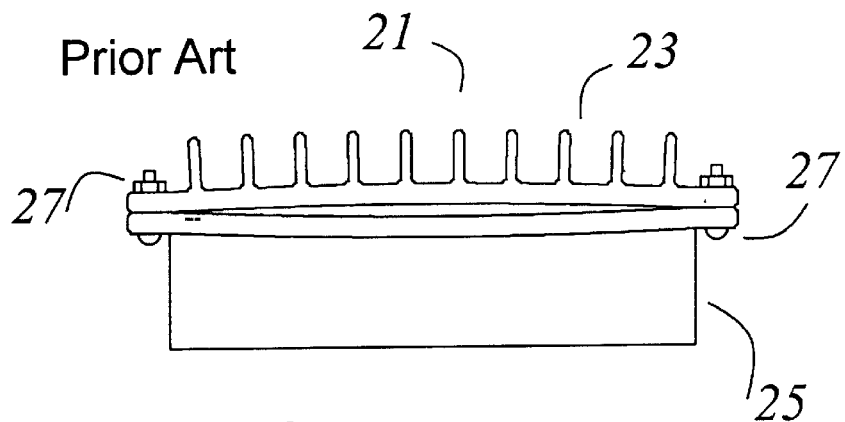
FIG. 2 shows prior art, showing warping in exaggerated scale and its consequences.

The assembly 21 of FIG. 2 shows a prior art heat sink 23 attached to a module 25 with nuts and bolts 27, 27. The consequence of warping is shown in exaggerated scale. Warping may be present in one or the other or both the heat sink 23 and the module 25; it may result from overtightening the nuts and bolts 27, 27; or it may result from trapped foreign matter. The resulting air gap is very detrimental to heat conductivity, and in the extreme may render the heat sink ineffective. The heat sink 23 and the module 25 have significant thickness to make them rigid enough to maintain flat surfaces at the interface, but if warping occurs, this rigidity makes it very difficult to restore good thermal contact.

Figure 3:
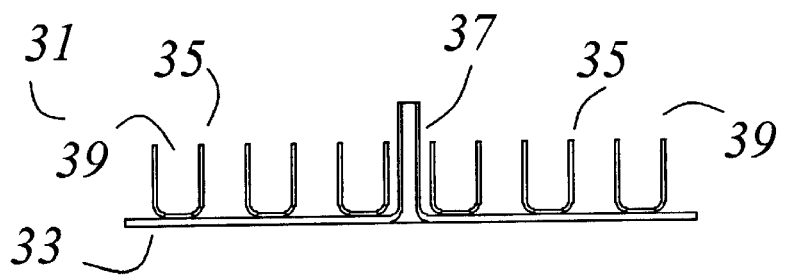
FIG. 3 shows a flexible heat sink.

FIG. 3 shows a flexible heat sink 31 of this invention. A plurality of heat sink fins 35—35 is bonded to a base plate 33. A tube 37 is attached to a hole in the base plate 33. Usually, it would be preferred that the tube 37 not extend above the heat sink fins 35—35, and it is shown as it is for emphasis. It could be a short tube, or it could be bent over to keep it below the heat sink fins 35—35.

The base plate 33 is preferably made of fairly soft material having very good thermal conductivity, such as annealed copper or slightly hard copper. The design and method of attaching the heat sink fins 35—35 is arbitrary, as long as there is very good thermal contact. Welding, soldering, silver soldering or brazing, as illustrations, not limitations, would be preferred, but an adhesive bond would be sufficient for some applications.

Although the base plate 33 should be soft enough to have flexibility, care must be taken to ensure that it is not dented or dinged up. If the heat sink fins 35—35 extend for substantial lengths on the heat sink 31, they may stiffen the heat sink excessively. This can be avoided and the heat transfer properties can be improved if they are cut at short intervals, and, perhaps, offset at the cuts in the pattern known as "slash and offset". This and other variations of heat sink fin design would be well known to one skilled in the art of heat sink design and thermal conductivity.

Figure 4:
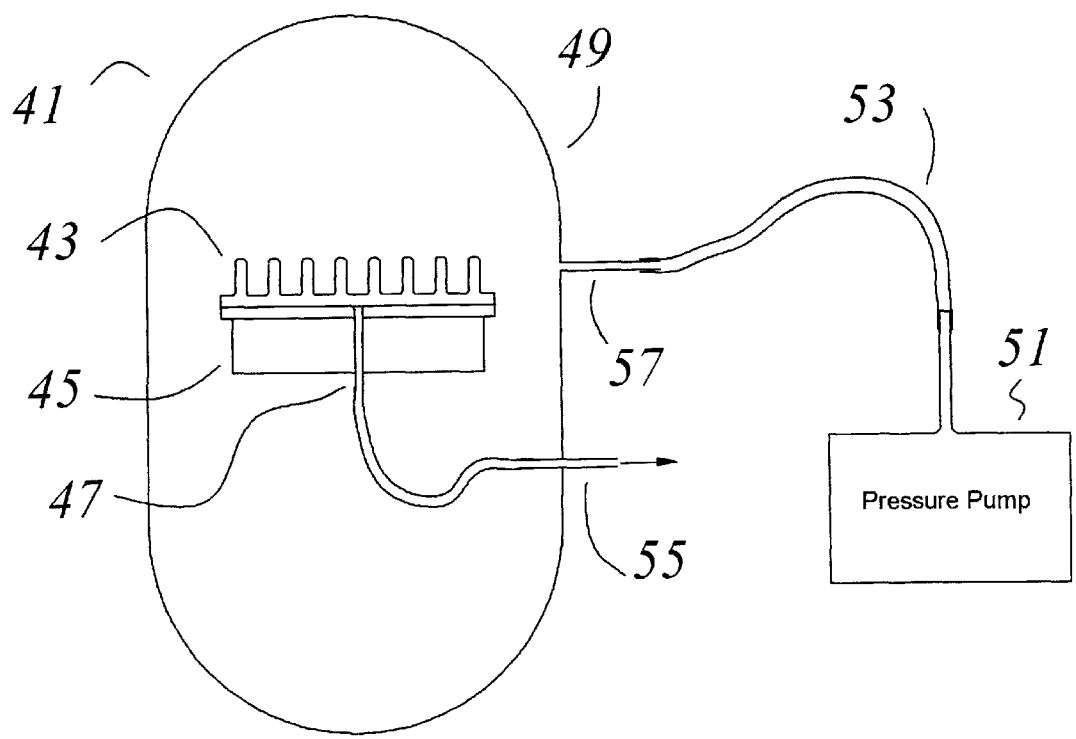
FIG. 4 shows a heat sink being attached to a module using external pressure.

FIG. 4 shows that a pressure vessel 49 may be used instead of a vacuum, the final result being equivalent. In the equipment 41 of FIG. 4, a heat sink 43 is attached to a module 45. A pressure pump 51 pressurizes the pressure vessel 49 through a hose 53 and an inlet tube 57. A hose 47 vents the heat sink to module interface through an outlet tube 55. The force that can be exerted by a vacuum pump is limited to one atmosphere, but a pressure vessel can be any pressure, so a much greater force can be applied, making the attachment method suitable for stiffer heat sinks or ones that are particularly badly warped. Excess adhesive will drain through the hose 47 and the outlet tube 55.

Note that in this example the heat sink interface is vented through the module 45 instead of the heat sink 43. In some applications, a vent through both the module and the heat sink might be used, for instance if there were a continuous film of dielectric insulation between the module and the heat sink. Unless the film of dielectric insulation had a hole in it, it would have to be vented from both sides.

The drain hose 55 could also be attached to a vacuum pump. This might be done if it were desired to purge all air from the interface. Then the adhesive could be introduced through the same tube.

Figure 5:
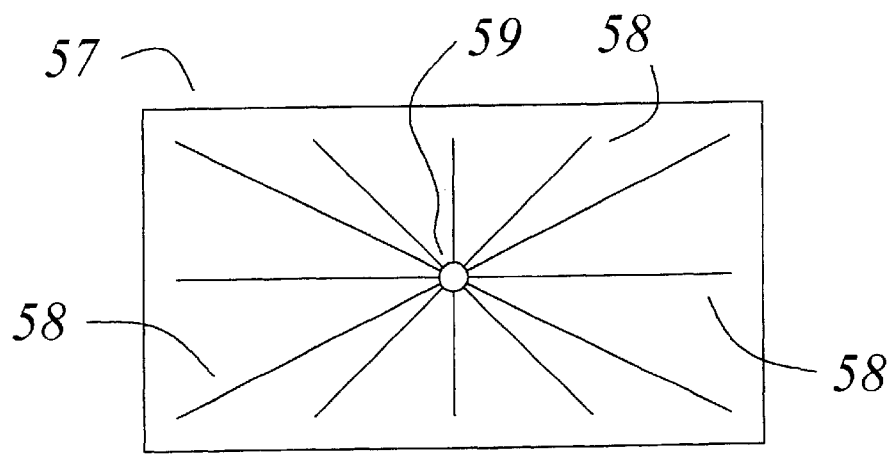
FIG. 5 shows channels in the heat sink surface.

FIG. 5 shows a heat sink 57 having a hole and tube 59 extending therefrom. The tube 59 is hidden, and extends from the other side of the heat sink 57. It is preferred to have a number of grooves 58—58 in the heat sink surface so that pulling the vacuum will not make a seal immediately around the tube 59 to the exclusion of the rest of the heat sink surface. The grooves can alternatively be on module's heat sink surface, or both. They need not be very wide or deep, though that would depend upon the viscosity of the adhesive and the distance that it had to spread.

These grooves 58—58 would also assist in the distribution of the adhesive or solder in the interface, particularly when the interface was first drawn to a high vacuum to exclude air, then the adhesive or solder was introduced through the same hole and allowed to spread. A small positive pressure might be used to introduce and spread the adhesive or solder, then a vacuum could be drawn again to remove any excess.

For larger heat sink surfaces it may be desirable or necessary to have a plurality of vent tubes. An applied vacuum would tend to pull the surfaces together in the vicinity of the vent tube, and this could tend to make a seal surrounding the vent tube. The grooves 58—58 would tend to prevent a tight seal, but even so, unless the grooves 58—58 were quite large (which would reduce the heat sink surface), the distance that a more viscous adhesive would flow under vacuum would be limited.

In the specification and the claims, a "vent tube" is any opening through the heat sink or the object from which heat is to be removed that can be used to introduce a pressure differential to press the heat sink surfaces together. If one or the other is fairly rigid, or if it can be supported, a vacuum could be introduced to a fixture holding it with a peripheral seal, and the "vent tubes" could be openings to the heat sink surface from the evacuated side.

Figure 6:
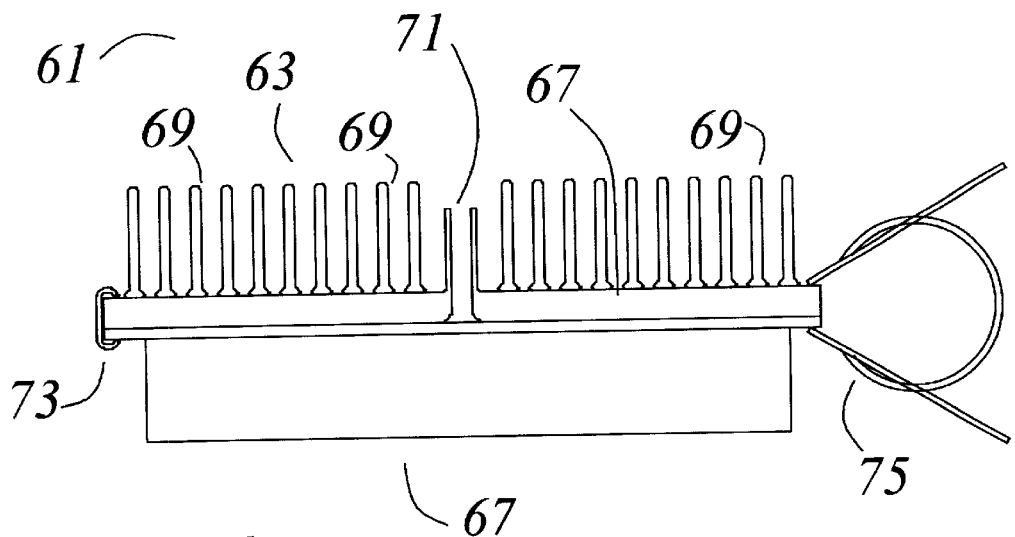
FIG. 6 shows a flexible module attached to a rigid heat sink and also shows alternative clamping means.

The assembly 61 of FIG. 6 shows rigid heat sink 63 mounted on a flexible module 67. A plurality of pins 69—69 has been welded to a base plate 67 as an illustration, not a limitation. A vacuum tube 71 attaches to a hole through the base plate 67. To ensure a good peripheral seal, it may be desirable to clamp the peripheral edges of the assembly 61 until the adhesive is cured. A permanent clamp 73 is shown on one side, and a temporary clamp 75 is shown on the other side, as illustrations, not limitations.

Figure 7:
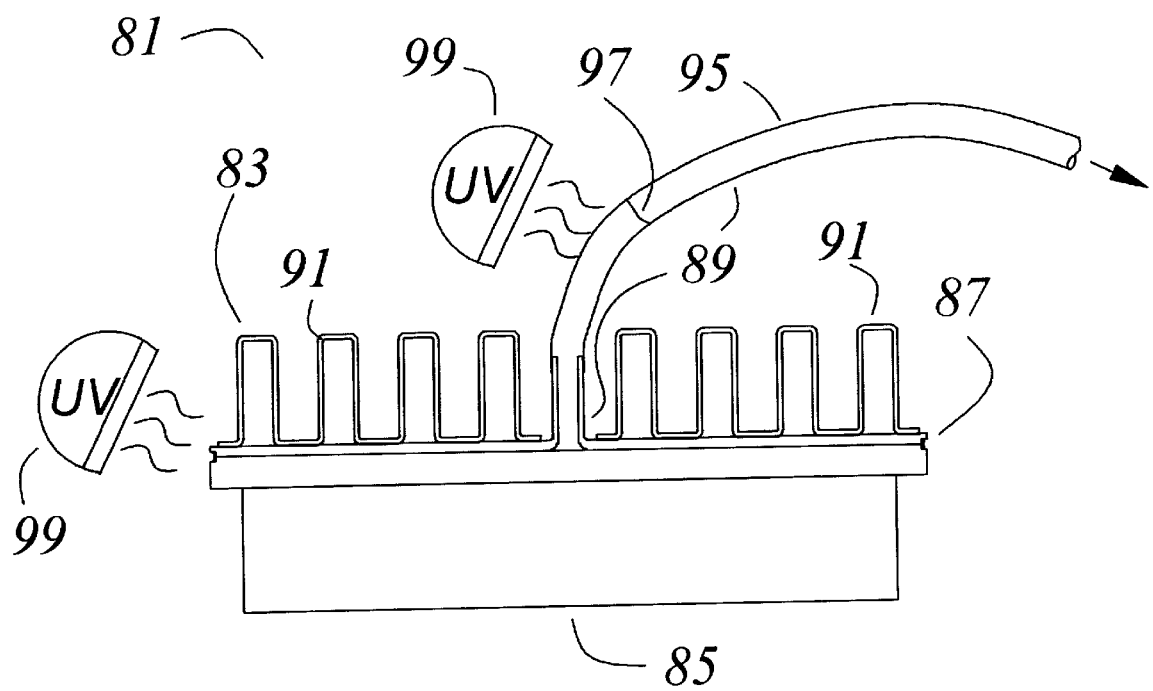
FIG. 7 show a flexible heat sink attached to a module with UV curing adhesive.

The assembly 81 of FIG. 7 shows a flexible heat sink 83 mounted on a module 85. The flexible heat sink 83 comprises a plurality of convoluted heat sink fins 91—91 bonded to a base plate 87. A tube 89 is attached to a hole through the base plate 87. A hose 95 may go to a vacuum pump, not shown.

It is contemplated that the flexible heat sink 83 might be bonded to the module 85 with an adhesive of the type known as a "multi-cure adhesive" and that can be cured by brief exposure to ultraviolet light (UV). It is further contemplated that a liberal amount of the multi-cure adhesive would be applied to the heat sink surfaces of the flexible heat sink 83 and/or the module 58. When they are put together and light pressure is applies, some of the adhesive will extrude out, forming a bead all around. This can be cured initially with a UV lamp 99 to make a peripheral seal.

Then a vacuum can be drawn, pulling the flexible heat sink 83 and the module 85 tightly together, for good thermal contact. If the hose 95 is transparent, then the excess adhesive 97 that is drawn up into the hose 95 can be cured by exposure to a UV lamp 99. Multi-cure adhesive is so named because it has more than one cure method. To cure the rest of the adhesive may require the application of heat. Alternatively, it may have been catalyzed, in which case it will cure with the passage of time. There may be additional ways to cure a multi-cure adhesive, and they are all equivalent for the teachings of this invention. After the cure is completed, the tube 89 may be cut off if desired.

Note that if a known quantity of adhesive is applied to the interface, the volume of the excess adhesive 97 that is drawn up the hose 97 should be fairly consistent. If less than usual is drawn up, it may indicate that the bond thickness is too great either because of trapped particles of contamination or else warping or distortion in excess of that which can be overcome by the vacuum.

Some adhesives may out-gas under vacuum. This suggests that too strong a vacuum should not be drawn, or perhaps a very strong vacuum may be drawn initially to remove any trapped bubbles, but then the vacuum should be relaxed allowing some adhesive to be pulled back into the interface to avoid voids.

The teachings of this invention apply and it is equivalent to use a flexible module base plate that can conform to a heat sink that is more rigid, or to use a flexible heat sink with a flexible base plate. An example of the former might be the attachment of a rigid heat sink to a "flex print" to heat sink the flex print or components mounted thereon. An example of the latter might be the attachment of a flexible heat sink of this invention to a flex print to heat sink the flex print or components mounted thereon. As yet another example, a module may be made on a thin copper base plate, perhaps for economy, perhaps to reduce the over thickness of the module. A heat sink of this invention may be applied to the module. Once bonded, the module and heat sink combination would be much more rigid than either alone.

Figure 8:
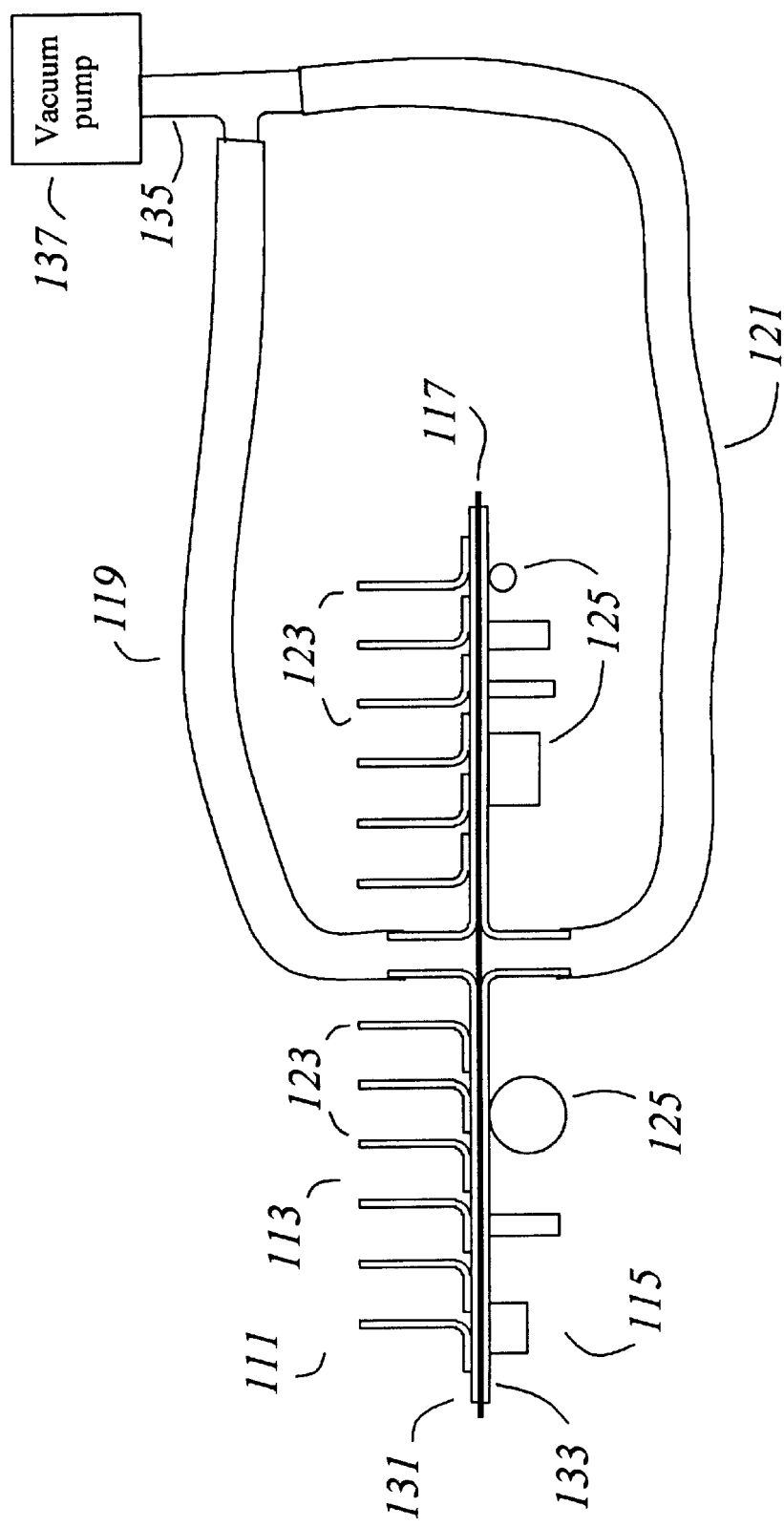
FIG. 8 shows a flexible heat sink attached to a flexible module.

FIG. 8 shows an assembly 111 comprising a flexible heat sink 113 being bonded to a flexible module 115. The flexible heat sink 113 comprises a flexible base plate 131 and a plurality of heat sink fins 123, 123. The flexible module 115 comprises a flexible circuit board 133 with components 125, 125 mounted thereon. A sheet 117 of thin dielectric material is between the flexible heat sink 113 and the flexible module 115, and is preferably made of a material having good thermal conductivity as well as electrical insulation. Because the sheet 117 of thin dielectric material would block a vacuum, two vacuum hoses 119 and 121 are used, joined in a tee 135 at a vacuum pump 135. Although shown flat, as an illustration, not a limitation, this technique could be used to join curved parts. Once bonded, the assembly 111 would be substantially more rigid than the parts of which it is made.

I claim:

1. A flexible heat sink comprising:
   a flexible metal base plate having first and second surfaces, the first surface comprising a heat sink surface, and the second surface comprising a heat sinking means to sink heat that is conducted through the heat sink surface from an object from which heat is to be removed; and
   at least one vent tube disposed through the second surface of the flexible metal base plate and extending to the heat sink surface.

2. The flexible heat sink of claim 1 wherein the vent tube is a substantially hollow cylindrical tube extending in substantially perpendicular relation from the second surface of the flexible metal base plate.

3. The flexible heat sink of claim 1 wherein the heat sink surface of the flexible metal base plate has grooves therein.

4. A flexible module for attachment to a heat sink having a heat sink surface, said flexible module comprising:
   a flexible metal base plate having first and second surfaces, wherein the first surface comprises a flexible heat sink surface for mounting to the heat sink; and the second surface comprises a mounting surface for mounting an object from which heat is to be removed; and
   at least one vent tube extending from the mounting surface to the flexible heat sink surface.

5. The module of claim 4 wherein the vent tube is a substantially hollow cylindrical tube extending in substantially perpendicular relation from the second surface of the flexible metal base plate.

6. A method of bringing an object from which heat is to be removed into good thermal contact with a heat sink, wherein the object from which heat is to be removed and the heat sink each comprise a heat sink surface, wherein the heat sink surface of at least one of the object from which heat is to be removed and the heat sink comprises a flexible heat sink surface, and wherein at least one of the object from which heat is to be removed and the heat sink has therein at least one vent tube in communication with a gap formed between the heat sink surface of the object and the heat sink surface of the heat sink, wherein the method comprises the steps of:
   applying at least one of an adhesive and a solder to at least one of the heat sink surface of the object from which heat is to be removed and the heat sink surface of the heat sink;
   aligning the heat sink surface of the object with the heat sink surface of the heat sink such that the gap formed therebetween is substantially filled by the at least one of the adhesive and the solder; and applying a pressure differential with respect to a pressure surrounding the object and the heat sink and a pressure at the gap between the heat sink surface of the object and the heat sink surface of the heat sink, said pressure differential being sufficient to draw the flexible heat sink surface toward the heat sink surface.

7. The method of claim 6 wherein the step of creating a pressure differential comprises the steps of attaching a vacuum pump to the vent tube and drawing a vacuum through the vent tube.

8. The method of claim 6 wherein the step of creating a pressure differential comprises the steps of:

disposing the heat sink and object in a pressure vessel;

attaching a hose to the vent tube, said hose being vented to atmospheric pressure; and pressurizing the pressure vessel to a pressure in excess of atmospheric pressure.

9. The method of claim 6 further comprising the step of removing an excess quantity of at least one of the adhesive and the solder through the vent tube.

10. An assembly comprising:

a heat sink having a heat sink surface;

an object from which heat is to be removed, said object having a heat sink surface disposed proximate to the heat sink surface of the heat sink; and a layer of at least one of an adhesive and a solder disposed in a gap formed between the heat sink surface of the object and the heat sink surface of the heat sink;

wherein at least one of the heat sink surface of the heat sink and the heat sink surface of the object from which heat is to be removed comprises a flexible heat sink surface; and wherein at least one of the heat sink and the object from which heat is to be removed has therein at least one vent tube in communication with the gap formed between the heat sink surface of the object and the heat sink surface of the heat sink.

11. The assembly of claim 10 further comprising peripheral clamps disposed about a periphery of the heat sink and the object such that the gap formed between the heat sink surface of the object and the heat sink surface of the heat sink are substantially isolated from a pressure surrounding the heat sink and the object.

12. The assembly of claim 10 wherein the adhesive is a multi-cure adhesive that can be cured by ultraviolet light, and wherein said multi-cure adhesive forms a peripheral seal disposed about a periphery of heat sink and the object such that the gap formed between the heat sink surface of the object and the heat sink surface of the heat sink are substantially isolated from a pressure surrounding the heat sink and the object.

13. The assembly of claim 10 wherein the flexible heat sink surface has grooves therein.

14. The assembly of claim 13 wherein both the heat sink surface of the heat sink and the heat sink surface of the object from which heat is to be removed comprise flexible heat sink surfaces.

15. The assembly of claim 10 further comprising peripheral clamps disposed about a periphery of the heat sink and the object such that the gap formed between the heat sink surface of the object and the heat sink surface of the heat sink are substantially isolated from a pressure surrounding the heat sink and the object.

16. The assembly of claim 10 wherein the adhesive is a multi-cure adhesive that can be cured by ultraviolet light, and wherein said multi-cure adhesive forms a peripheral seal disposed about a periphery of heat sink and the object such that the gap formed between the heat sink surface of the object and the heat sink surface of the heat sink are substantially isolated from a pressure surrounding the heat sink and the object.

17. The assembly of claim 10 wherein each of the flexible heat sink surfaces has grooves therein.

18. The assembly of claim 10 wherein each of the heat sink and the object from which heat is to be removed has therein at least one vent tube in communication with the gap formed between the heat sink surface of the object and the heat sink surface of the heat sink.

19. The assembly of claim 10 wherein the heat sink surface of the object is a flexible heat sink surface and wherein the at least one vent tube is disposed through the heat sink surface of the heat sink.

20. The assembly of claim 10 wherein the heat sink surface of the heat sink is a flexible heat sink surface and wherein the at least one vent tube is disposed through the heat sink surface of the object.

* * * * *